(12) United States Patent
Zhang et al.

(10) Patent No.: US 12,389,591 B2
(45) Date of Patent: Aug. 12, 2025

(54) SEMICONDUCTOR STRUCTURE AND METHOD FOR MANUFACTURING SEMICONDUCTOR STRUCTURE

(71) Applicant: CHANGXIN MEMORY TECHNOLOGIES, INC., Hefei (CN)

(72) Inventors: Kui Zhang, Hefei (CN); Zhan Ying, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 528 days.

(21) Appl. No.: 17/650,274

(22) Filed: Feb. 8, 2022

(65) Prior Publication Data

US 2022/0157828 A1 May 19, 2022

Related U.S. Application Data

(63) Continuation of application No. PCT/CN2021/106604, filed on Jul. 15, 2021.

(30) Foreign Application Priority Data

Sep. 30, 2020 (CN) .......................... 202011056615.8

(51) Int. Cl.
*H10B 12/00* (2023.01)
*H10D 30/01* (2025.01)
*H10D 30/67* (2025.01)

(52) U.S. Cl.
CPC ........... *H10B 12/482* (2023.02); *H10B 12/05* (2023.02); *H10B 12/315* (2023.02); *H10D 30/031* (2025.01); *H10D 30/6728* (2025.01)

(58) Field of Classification Search
CPC ............... H01L 29/66742; H01L 29/78; H01L 29/78642; H10B 12/05; H10B 12/315; H10B 12/482; H10B 12/488; H10D 30/031; H10D 30/60; H10D 30/6728
See application file for complete search history.

(56) References Cited

U.S. PATENT DOCUMENTS

| 5,817,552 A | 10/1998 | Roesner |
| 7,948,027 B1* | 5/2011 | Renn ...................... H10B 12/36 257/349 |
| 8,907,417 B2 | 12/2014 | Yang |
| 9,224,741 B2 | 12/2015 | Yang |

(Continued)

FOREIGN PATENT DOCUMENTS

| CN | 101090117 A | 12/2007 |
| CN | 107026087 A | 8/2017 |

(Continued)

OTHER PUBLICATIONS

U.S. Appl. No. 17/503,475, filed Oct. 18, 2021. (Year: 2021).*

*Primary Examiner* — Britt D Hanley
*Assistant Examiner* — Kevin Quinto
(74) *Attorney, Agent, or Firm* — Syncoda LLC; Feng Ma

(57) ABSTRACT

A semiconductor structure includes a semiconductor base, a bit line and a word line. The semiconductor base includes a substrate and an isolation structure arranged above the substrate and configured to isolate a plurality of active regions from each other. The bit line is arranged in the substrate and connected to the plurality of active regions. The word line intersects with the plurality of active regions and surrounds the plurality of active regions.

15 Claims, 24 Drawing Sheets

(56) References Cited

U.S. PATENT DOCUMENTS

| | | | | |
|---|---|---|---|---|
| 10,134,739 B1* | 11/2018 | Zang | ................... | H01L 27/1248 |
| 2010/0090263 A1 | 4/2010 | Kunkel | | |
| 2013/0334583 A1 | 12/2013 | Yang | | |
| 2015/0054066 A1 | 2/2015 | Yang | | |
| 2022/0102381 A1* | 3/2022 | Zhang | .................. | H10B 12/485 |
| 2022/0165738 A1* | 5/2022 | Zhang | .............. | H01L 29/78642 |

FOREIGN PATENT DOCUMENTS

| | | |
|---|---|---|
| CN | 108461496 A | 8/2018 |
| CN | 108878424 A | 11/2018 |
| CN | 109003938 A | 12/2018 |
| CN | 109309092 A | 2/2019 |
| CN | 110896074 A | 3/2020 |
| CN | 110931429 A | 3/2020 |
| CN | 110931487 A | 3/2020 |
| CN | 110957319 A | 4/2020 |

* cited by examiner

SEMICONDUCTOR STRUCTURE AND METHOD FOR MANUFACTURING SEMICONDUCTOR STRUCTURE

CROSS-REFERENCE TO RELATED APPLICATIONS

This is a continuation of International Patent Application No. PCT/CN2021/106604 filed on Jul. 15, 2021, which claims priority to Chinese patent application No. 202011056615.8 filed on Sep. 30, 2020. The disclosures of the above-referenced applications are hereby incorporated by reference in their entirety.

BACKGROUND

With the increase of the integration in a semiconductor manufacturing process, it is a tendency to improve the integration density of a memory.

A dynamic random access memory (DRAM) is a semiconductor memory, which includes an array region consisting of a plurality of memory cells and a peripheral region constituted by a control circuit. Each memory cell includes a transistor electrically connected to a capacitor, and the transistor controls storage or release of charge in the capacitor to achieve the purpose of storing data. The control circuit may be located to each memory cell to control the access of the data thereof through a word line (WL) and a bit line (BL) which span across the array region and are electrically connected to each memory cell.

SUMMARY

The disclosure relates to the field of semiconductors, and in particular to a semiconductor structure and a method for manufacturing the semiconductor structure.

The disclosure provides a semiconductor structure and a method for manufacturing the semiconductor structure.

According to a first aspect of the disclosure, a semiconductor structure is provided, including a semiconductor base, at least one bit line and at least one word line.

The semiconductor base includes a substrate and an isolation structure. The isolation structure is arranged above the substrate and configured to isolate a plurality of active regions from each other.

The bit line is arranged in the substrate and connected to the plurality of active regions.

The word line intersects with the plurality of active regions and surrounds the plurality of active regions.

According to a second aspect of the disclosure, a method for manufacturing a semiconductor structure is provided, including the following operations.

A substrate is formed.

A bit line is formed in the substrate.

A plurality of active regions are formed on the substrate. The bit line is connected to the plurality of active regions.

A word line is formed above the bit line. The word line intersects with the plurality of active regions and surrounds the plurality of active regions.

It should be understood that, both the foregoing general description and the following detailed description are exemplary and explanatory only and are not restrictive of the disclosure.

BRIEF DESCRIPTION OF THE DRAWINGS

Various objects, features, and advantages of the disclosure will become more apparent from the following detailed description of preferred embodiments of the disclosure when considered in combination with the accompanying drawings. The drawings are only exemplary illustrations of the disclosure and are not necessarily drawn to scale. In the drawings, like reference numerals refer to the same or similar parts throughout. In the drawings.

Figure 1:
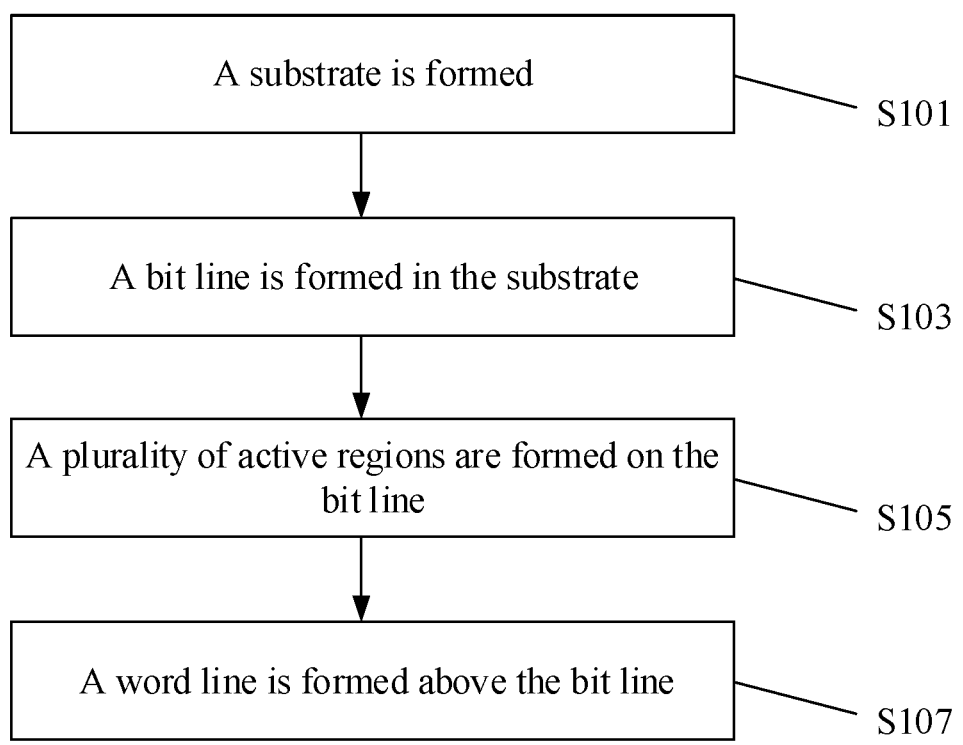
FIG. 1 is a flow chart of a method for manufacturing a semiconductor structure according to an exemplary embodiment.

Reference numerals are illustrated as follows.

10, semiconductor base; 11, active region; 111, drain region; 112, channel region; 113, source region; 12, substrate; 121, first semiconductor layer; 122, oxide insulation layer; 123, second semiconductor layer; 13, isolation structure; 131, first insulating dielectric layer; 132, gate oxide layer; 133, second insulating dielectric layer; 20, bit line; 21, bit line isolation layer; 22, barrier layer; 23, conductive layer; 30, word line;

40, opening; 41, third semiconductor layer; 42, fourth semiconductor layer; 44, conductive material layer; 45, oxide layer; 46, nitride layer; 47, photoresist.

DETAILED DESCRIPTION

Typical embodiments that embody the features and advantages of the disclosure will be described in detail in the following description. It is to be understood that the disclosure can be changed in different embodiments without departing from the scope of the disclosure, and that the description and drawings are illustrative in nature and are not intended to limit the disclosure.

In the following description of different exemplary embodiments of the disclosure, reference is made to the accompanying drawings, which form a part of the disclosure, and in which different exemplary structures, systems, and operations for implementing various aspects of the disclosure are shown by way of an example. It is to be understood that other specific solutions of a part, a structure, an exemplary device, a system, and an operation may be utilized, and a structural and functional modification may be made without departing from the scope of the disclosure. Moreover, although terms "above", "between", "within", and the like may be used in the specification to describe different exemplary features and elements of the disclosure, these terms are used herein for convenience only, for example, according to a direction of the example in the drawings. Any content in the specification should not be construed as requiring a specific three-dimensional direction of the structure to fall within the scope of the disclosure.

In an DRAM, an embedded type WL structure is mainly adopted, which is greater in unit configuration size and limited in control ability.

An embodiment of the disclosure provides a method for manufacturing a semiconductor structure. Referring to FIG. 1, the method for manufacturing the semiconductor structure includes the following operations.

S101, a substrate 12 is formed.

S103, a bit line 20 is formed in the substrate 12.

S105, a plurality of active regions 11 are formed on the substrate 12. The bit line 20 is connected to the plurality of active regions 11.

S107, a word line 30 is formed above the bit line 20. The word line 30 intersects with the plurality of active regions 11 and surrounds the plurality of active regions 11.

According to the method for manufacturing the semiconductor structure in an embodiment of the disclosure, the embedded type bit line 20 is formed in the substrate 12, and the active regions 11 and the word line 30 are formed above the bit line 20. The word line 30 is connected to the active regions 11 and the word line 30 intersects with the active regions 11, so that bit line contact holes for connecting the bit line 20 to the active regions 11 are omitted. The unit configuration size on the substrate 12 is small, i.e., the size of the semiconductor structure may be further reduced, and the control ability of the embedded type bit line 20 is stronger, so that the performance of the semiconductor structure is improved.

It should be noted that, a vertical type memory transistor is formed on an overlapped area in which the bit line 20 spatially intersects with the word line 30, and the vertical type transistor is arranged on the bit line 20 and connected to the bit line 20. One overlapped area corresponds to one vertical type memory transistor. The vertical type memory transistor includes active regions 11.

In a related art, the width size of one memory transistor in a direction perpendicular to the word line is 3F, and the width size of one memory transistor in a direction perpendicular to the bit line is 2F. The area of one memory transistor that needs to be configured on the substrate is 6F2 (3F*2F, namely a 3×2 embedded type word line structure), in which F is the minimum feature size. That is, the minimum line width size and the minimum line spacing size may be obtained based on the resolution of a current lithography apparatus. The minimum linear width size and the minimum linear spacing size are equal. Based on the resolution of the current lithography apparatus, the unit size of the manufactured memory transistor may only be 6F2, which may not be further reduced.

The unit configuration size refers to the unit configuration size, which needs to be configured on a substrate, for a memory cell. The unit configuration size includes a size actually occupied by one memory cell on the substrate, and a spacing size needing to be reserved between the memory cell and an adjacent memory cell. For example, if the size occupied by N memory transistors on the substrate is M, the unit configuration size of one memory transistor on the substrate is N/M. For the vertical type memory transistor based on a vertical structure, the word line and the bit line spatially intersect with each other and have an overlapped area, and one overlapped area corresponds to one vertical type memory transistor.

According to the semiconductor structure manufactured in the embodiment, the bit line 20 with the minimum feature size F and the word line 30 with the minimum feature size F may be formed according to related preparation processes, and both the line spacing between the formed adjacent bit lines 20 and the line spacing between the formed adjacent word lines 30 is greater than or equal to the minimum feature size F, so that the width size of one vertical type memory transistor in the direction perpendicular to the bit lines is 2F and the width size of one vertical type memory transistor in a direction perpendicular to the word lines is also 2F. As a result, the unit configuration size of the vertical type memory transistor may be 4F2 accordingly (2F*2F, namely a 2×2 embedded type bit line structure). That is, the unit configuration size of the vertical type memory transistor is greater than or equal to 4 times the square of the minimum feature size. Compared with 3×2 embedded type word line structure, the unit configuration size is smaller, namely stacking density is higher.

In an embodiment, the substrate 12 is an SOI substrate.

In an embodiment, the method for manufacturing the semiconductor structure further includes the following operation. An isolation structure 13 covering the substrate 12 is formed. The word line 30 and the active regions 11 are arranged in the isolation structure 13.

In an embodiment, the operation that the substrate 12 is formed includes the following operations. A first semiconductor layer 121 is provided, an oxide insulation layer 122 is formed on the first semiconductor layer 121, and a second semiconductor layer 123 is formed on the oxide insulation layer 122.

Specifically, the first semiconductor layer 121 may be made of a silicon-containing material. The first semiconductor layer 121 may be made of any suitable material, for example including at least one of silicon, monocrystalline silicon, polysilicon, amorphous silicon, silicon germanium, monocrystalline silicon germanium, polysilicon germanium and carbon doped silicon.

The oxide insulation layer 122 may include materials such as Silicon Dioxide ($SiO_2$) and Silicon Oxycarbide (SiOC).

The second semiconductor layer 123 may be made of a silicon-containing material. The second semiconductor layer 123 may be made of any suitable material, for example including at least one of silicon, monocrystalline silicon, polysilicon, amorphous silicon, silicon germanium, monocrystalline silicon germanium, polysilicon germanium and carbon doped silicon.

It is to be noted that, the first semiconductor layer 121, the oxide insulation layer 122 and the second semiconductor layer 123 form the Silicon-On-Insulator (SOI) in which the bit line 20 is arranged.

In an embodiment, the thickness of the oxide insulation layer 122 is greater than 100 nm, and the thickness of the second semiconductor layer 123 ranges from 18 nm to 22 nm.

In an embodiment, the operation that the bit line 20 is formed includes the following operations. An opening 40 is formed in the substrate 12, in which a bottom surface of the opening 40 is arranged in the oxide insulation layer 122. The bit line 20 is formed in the opening 40. A top end of the bit line 20 is not higher than a lower surface of the second semiconductor layer 123, namely the bit line 20 is embedded into the oxide insulation layer 122.

Figure 2:
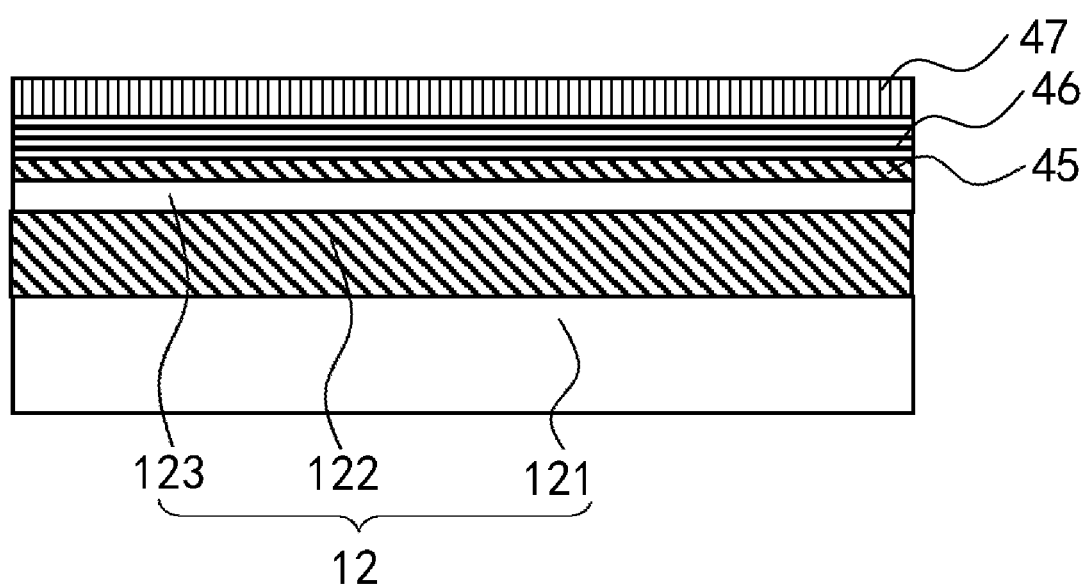
FIG. 2 is a schematic diagram illustrating the formation of a substrate and a mask layer in a method for manufacturing a semiconductor structure according to an exemplary embodiment.
Figure 3:
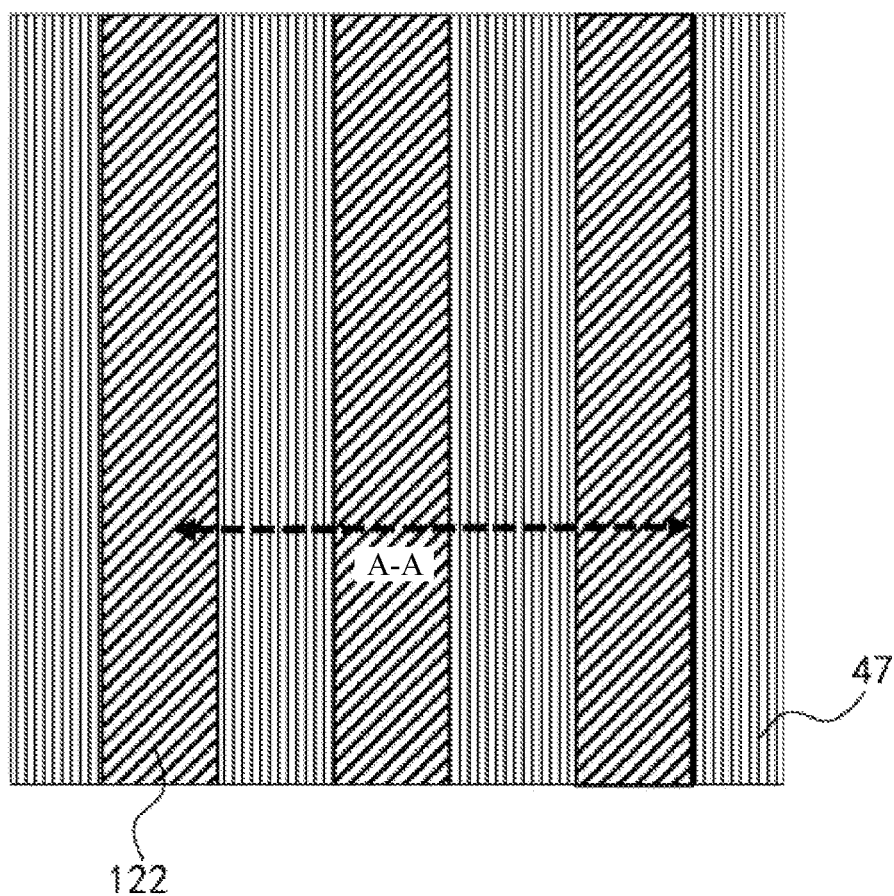
FIG. 3 is a top view illustrating the formation of an opening in a method for manufacturing a semiconductor structure according to an exemplary embodiment.
Figure 4:
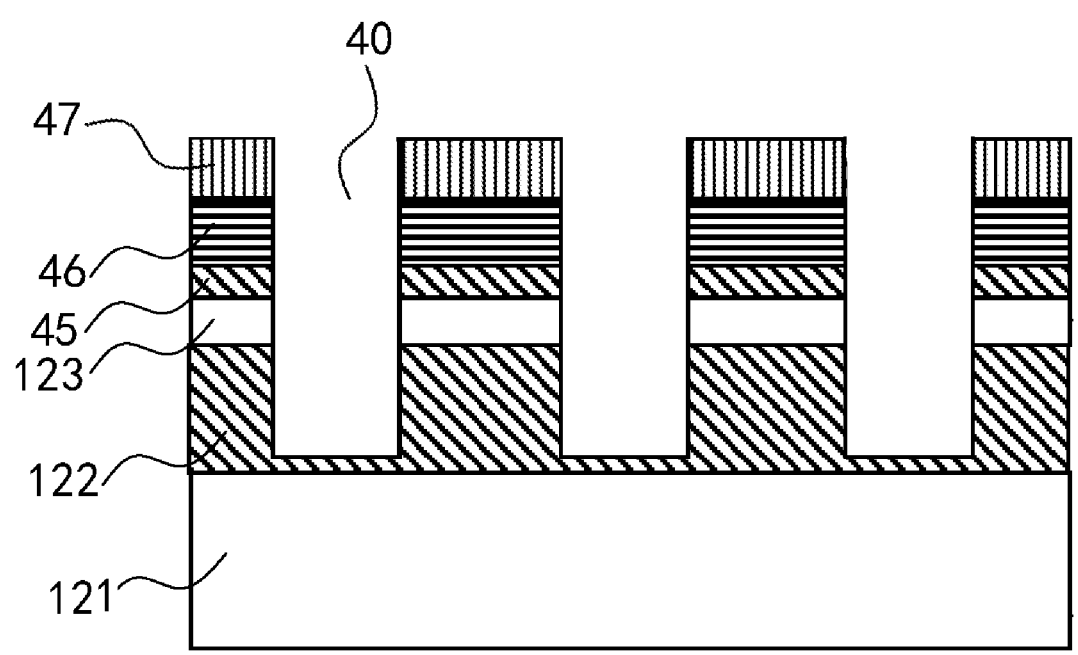
FIG. 4 is a cross-sectional view taken along A-A in FIG. 3.

In an embodiment, in combination with FIG. 2, a mask layer is covered on the SOI formed through the first semiconductor layer 121, the oxide insulation layer 122 and the second semiconductor layer 123, and a mask pattern is formed on the mask layer. The mask pattern corresponds to an area where the bit line 20 is located (a three-dimensional type space, that is, upper and lower spaces are areas where the bit line 20 is located based on a plane where the bit line 20 is located). The opening 40 is formed by etching the area where the mask pattern is located, with reference to FIG. 3 and FIG. 4. The bit line 20 is finally formed in the opening 40, with reference to FIG. 5 and FIG. 6.

In an embodiment, the mask layer includes an oxide layer 45, a nitride layer 46 and photoresist 47. In combination with FIG. 2, the oxide layer 45 is formed on the second semiconductor layer 123, the nitride layer 46 is formed on the oxide layer 45, and the photoresist 47 is formed on the nitride layer 46. The opening 40 is formed by photoetching. The opening 40 does not penetrate through the oxide insulation layer 122, and the depth of the opening 40 in the oxide insulation layer 122 ranges from 40 nm to 70 nm and the width of the opening 40 in the oxide insulation layer 122 ranges from 30 nm to 70 nm.

It is to be noted that, the oxide insulation layer 122, the oxide layer 45, the nitride layer 46 and the photoresist 47 may be formed through a Physical Vapor Deposition (PVD) process, a Chemical Vapor Deposition (CVD) process or an Atomic Layer Deposition (ALD) process.

In an embodiment, the bit line 20 includes a bit line isolation layer 21 arranged in the oxide insulation layer 122, a barrier layer 22 covering an inner surface of the bit line isolation layer 21, and a conductive layer 23 arranged in the barrier layer 22. The barrier layer 22 covers an upper surface of the conductive layer 23, and the barrier layer 22 is connected to the active regions 11.

Figure 5:
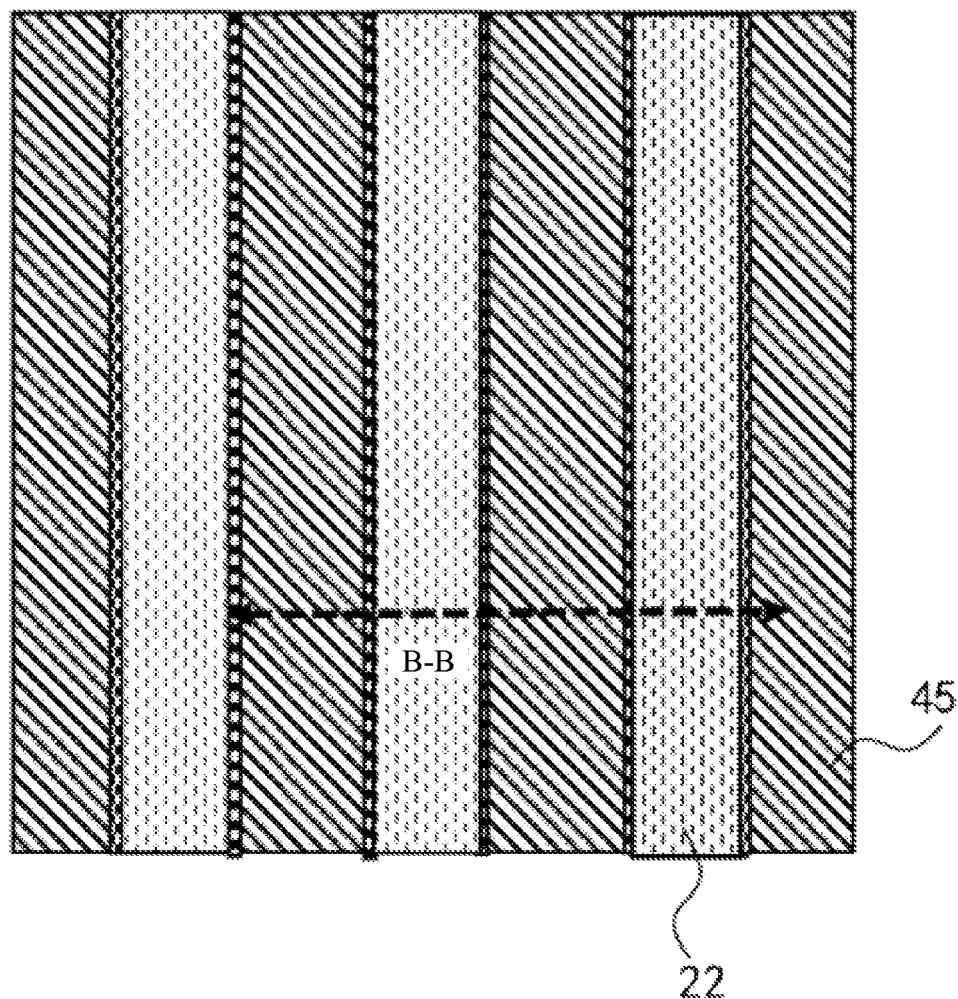
FIG. 5 is a top view illustrating the formation of a bit line in a method for manufacturing a semiconductor structure according to an exemplary embodiment.
Figure 6:
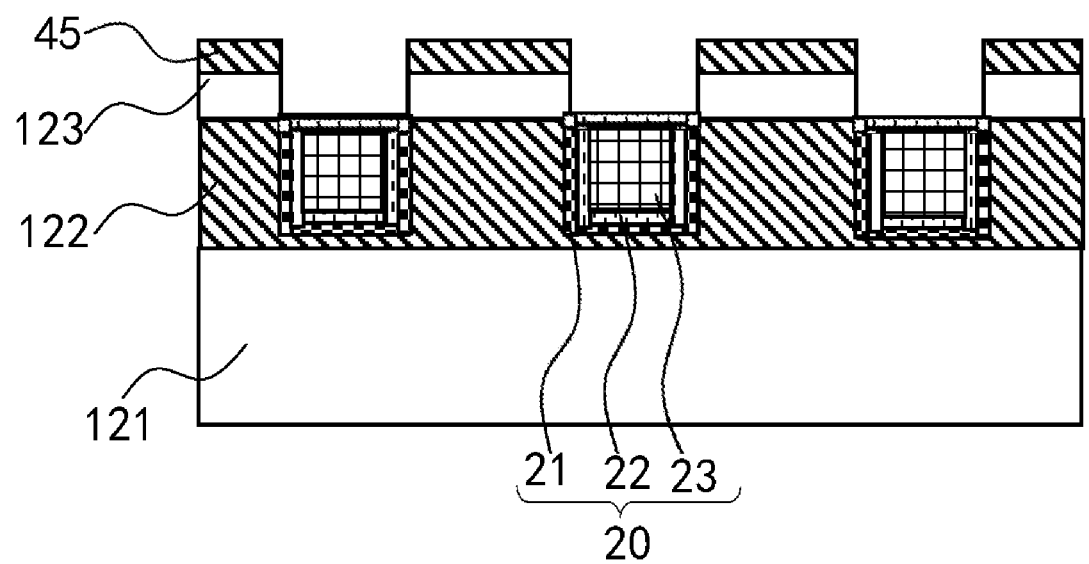
FIG. 6 is a cross-sectional view taken along B-B in FIG. 5.

In combination with FIG. 5 and FIG. 6, the bit line isolation layer 21 covering the inner surface of the opening 40 is formed in the opening 40. The barrier layer 22 covering the inner surface of the bit line isolation layer 21 is formed in the opening 40. The conductive layer 23 is filled in the opening 40. The barrier layer 22 covers the upper surface of the conductive layer 23. The barrier layer 22 may only cover the upper surface of the conductive layer 23, that is to say, the upper surface of the bit line isolation layer 21 is exposed. Certainly, the barrier layer 22 may completely cover the upper surface of the conductive layer 23 and the upper surface of the bit line isolation layer 21.

Specifically, the bit line isolation layer 21 may include materials such as Silicon Nitride (SiN) and Nitrogen Silicon Carbide (SiCN). The barrier layer 22 may include at least one of Tungsten Silicide (WSi), Titanium Nitride (TIN) and Titanium (TI), and the conductive layer 23 may include Tungsten (W).

It is to be noted that, the bit line isolation layer 21, the barrier layer 22 and the conductive layer 23 may be formed through a PVD process, a CVD process, an ALD process, a remote plasma nitridization (RPN) process, a thermal oxidization process, and the like, which may be not limited herein.

In an embodiment, the operation that the active regions 11 are formed includes the following operations. A drain region 111 is formed on the bit line 20; a channel region 112 is formed on the drain region 111; and a source region 113 is formed on the channel region 112. That is to say, the drain region 111, the channel region 112 and the source region 113 are sequentially arranged in the vertical direction to form three-dimensional type active regions 11.

In an embodiment, the operation that the active regions 11 are formed includes the following operations. A third semiconductor layer 41 covering an upper surface of the bit line 20 is formed on the second semiconductor layer 123. A portion of the second semiconductor layer 123 and a portion of the third semiconductor layer 41 are etched, in which a remaining portion of the second semiconductor layer 123 and a remaining portion of the third semiconductor layer 41 form the drain region 111. A fourth semiconductor layer 42 is formed on the drain region 111. A portion of the fourth semiconductor layer 42 is etched, in which a remaining portion of the fourth semiconductor layer 42 forms the channel region 112 and the source region 113, and the drain region 111, the channel region 112 and the source region 113 form the active regions 11.

Figure 7:
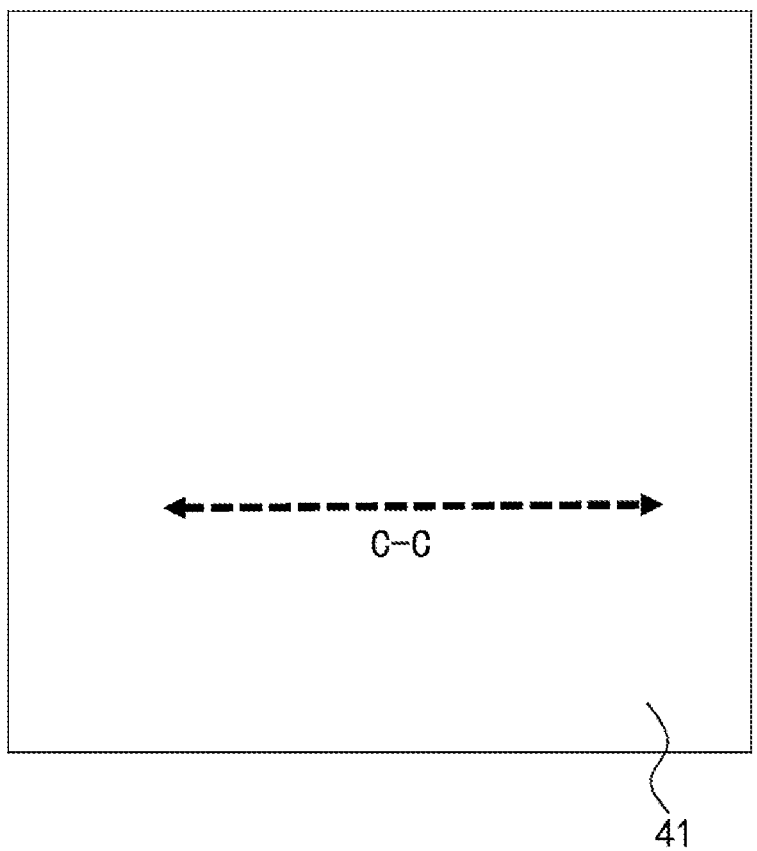
FIG. 7 is a top view illustrating the formation of a third semiconductor layer in a method for manufacturing a semiconductor structure according to an exemplary embodiment.
Figure 8:
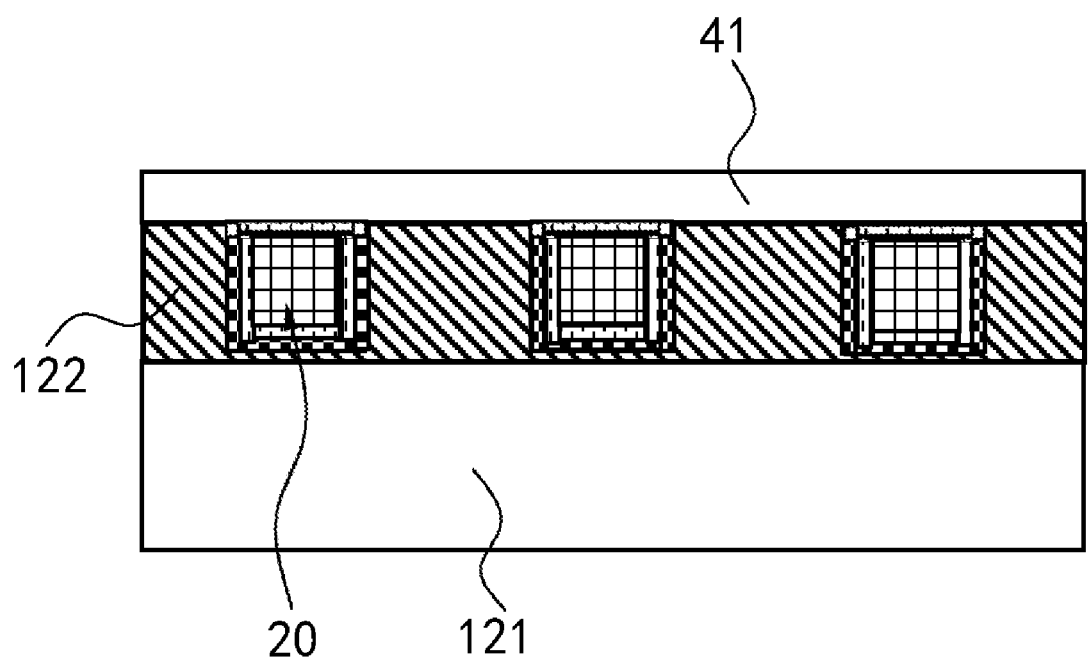
FIG. 8 is a cross-sectional view taken along C-C in FIG. 7.

Specifically, after the bit line 20 is formed, the mask layer covering the second semiconductor layer 123 is removed, and the third semiconductor layer 41 is formed on the second semiconductor layer 123. As shown in FIG. 7 and FIG. 8, the third semiconductor layer 41 covers the bit line 20, and the second semiconductor layer 123 and the third semiconductor layer 41 may be made of the same material.

Figure 9:
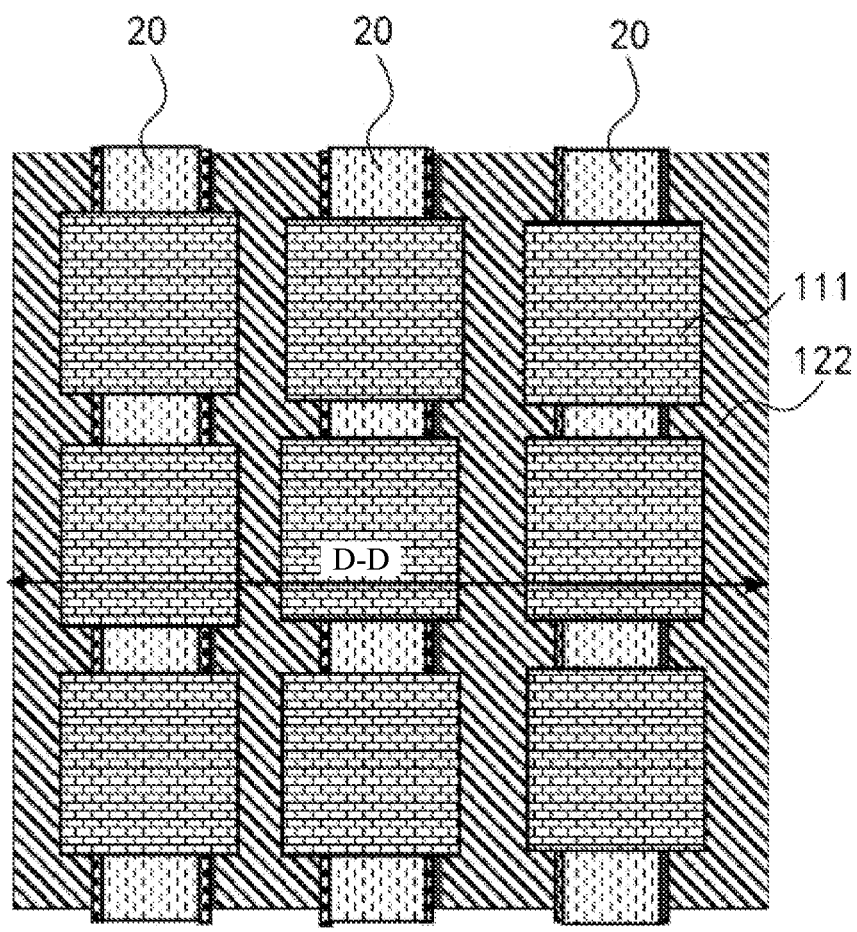
FIG. 9 is a top view illustrating the formation of a drain region in a method for manufacturing a semiconductor structure according to an exemplary embodiment.
Figure 10:
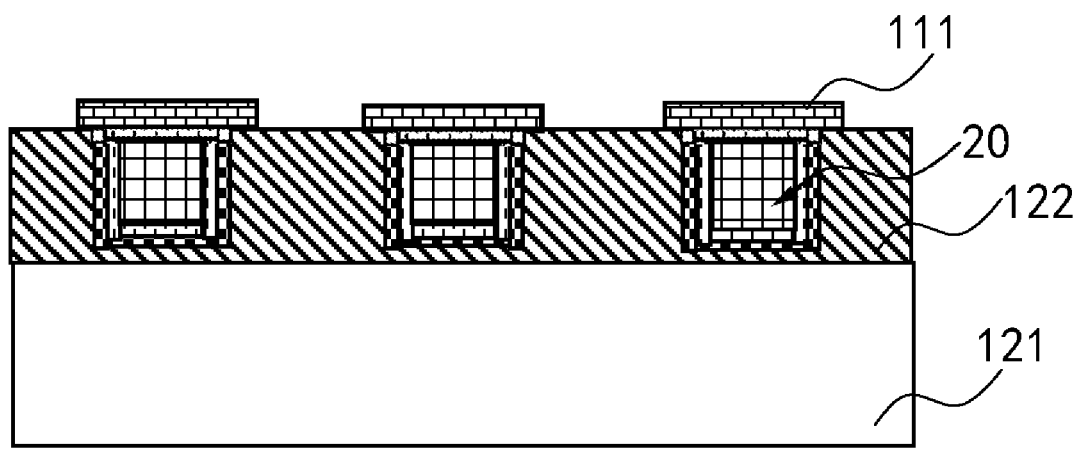
FIG. 10 is a cross-sectional view taken along D-D in FIG. 9.

The third semiconductor layer 41 is covered with the mask layer, and a mask pattern is formed on the mask layer and corresponds to an area where the drain region 111 is located. The second semiconductor layer 123 and the third semiconductor layer 41 outside the mask pattern are etched, and a remaining portion of the second semiconductor layer 123 and a remaining portion of the third semiconductor layer 41 form a plurality of drain regions 111 which are spaced apart from each other as shown in FIG. 9 and FIG. 10. In the embodiment, the width of the drain region 111 is greater than the width of the bit line 20. Further, the width of the drain region 111 is greater than the width of the bit line 20 by 3 nm to 10 nm.

In an embodiment, the second semiconductor layer 123 and the third semiconductor layer 41 may be made of monocrystalline silicon. The drain region 111 is formed by in-situ doping the monocrystalline silicon or implanting ions to the monocrystalline silicon after the third semiconductor layer 41 is formed on the second semiconductor layer 123 through an epitaxial growth (Epi) process, that is, after the second semiconductor layer 123 and the third semiconductor layer 41 form the monocrystalline silicon. The second semiconductor layer 123 may be formed by an Epi process.

Correspondingly, the fourth semiconductor layer 42 may be made of monocrystalline silicon, and the channel region 112 and the source region 113 are formed by in-situ doping said monocrystalline silicon or implanting ions to said monocrystalline silicon after said monocrystalline silicon is formed based on the drain region 111 through an Epi process.

In the embodiment, the Epi process may be a selective Epi process.

It is to be noted that, the drain region 111, the channel region 112 and the source region 113 respectively form a drain, a trench region and a source of a vertical type memory transistor. Each of the drain region 111, the channel region 112 and the source region 113 includes first doping, second doping and third doping, the first doping and the third doping are first conductive type doping, and the second doping is second conductive type doping contrary to the first conductive type doping. The first conductive type doping may be P type and the second conductive type doping may be N type; or the first conductive type doping many be N type and the second conductive type doping may be P type. The source region 113 is configured to be connected to a memory element (for example, a memory capacitor).

In an embodiment, the operation that the word line 30 is formed includes the following operations. A first insulating dielectric layer 131 covering a side wall of the drain region 111 is formed on the oxide insulation layer 122. A gate oxide layer 132 is formed on the first insulating dielectric layer 131, in which the gate oxide layer 132 covers a top end of the drain region 111, a side wall of the channel region 112 and a bottom end and a side wall of the source region 113. A conductive material layer 44 is formed on a surface of the gate oxide layer 132. The conductive material layer 44 outside an area in which the word line 30 is to be located is etched, in which a remaining portion of the conductive material layer 44 forms the word line 30. A second insulating dielectric layer 133 is formed on the first insulating dielectric layer 131, in which the channel region 112, the source region 113 and the word line 30 are arranged in the second insulating dielectric layer 133, and the first insulating dielectric layer 131 and the second insulating dielectric layer 133 form an isolation structure 13.

Figure 11:
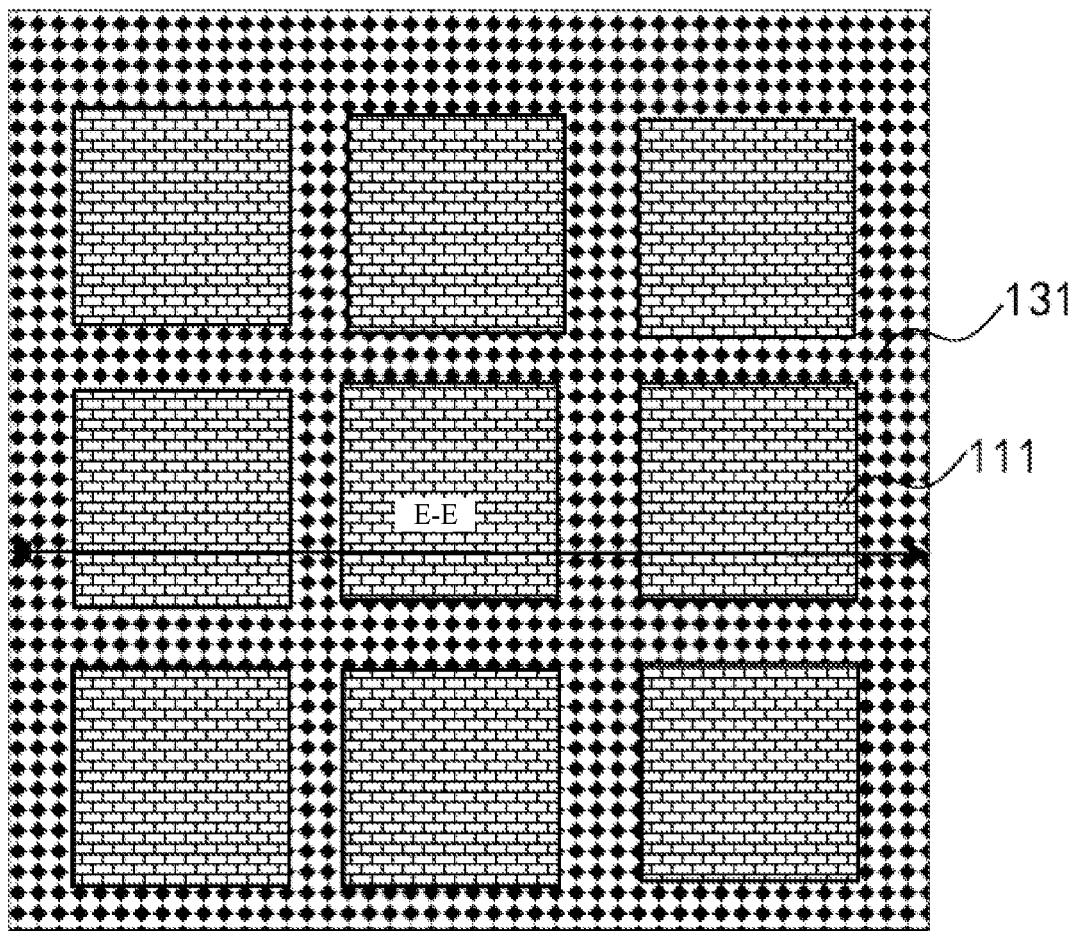
FIG. 11 is a top view illustrating the formation of a first insulating dielectric layer in a method for manufacturing a semiconductor structure according to an exemplary embodiment.
Figure 12:
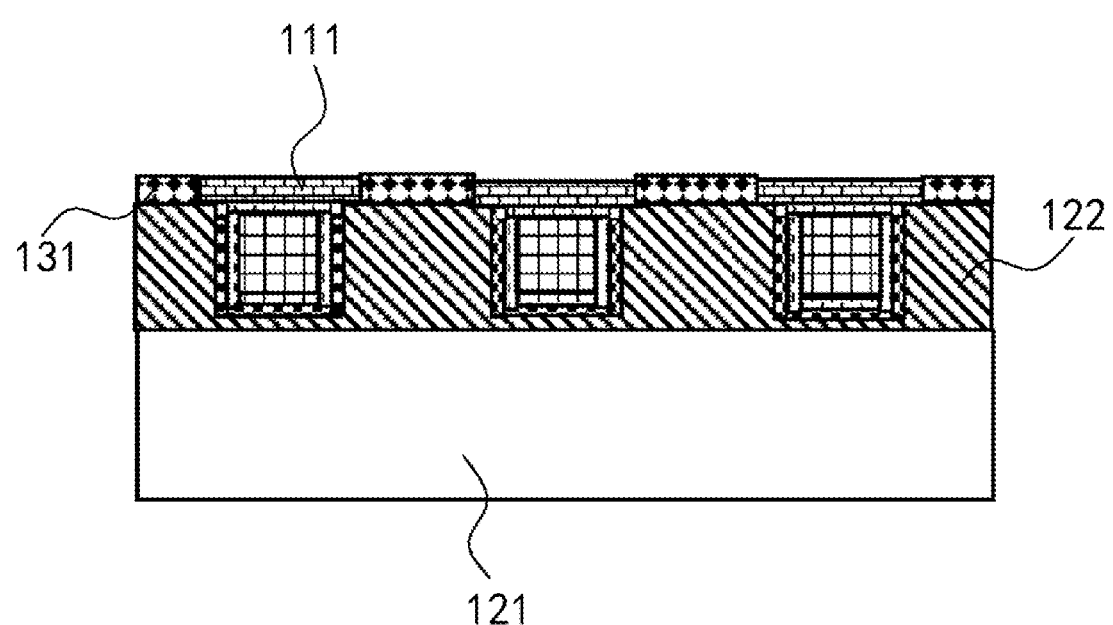
FIG. 12 is a cross-sectional view taken along E-E in FIG. 11.

On the basis of FIG. 9 and FIG. 10, after the drain region 111 is formed, the first insulating dielectric layer 131 covering the side wall of the drain region 111 is formed on the oxide insulation layer 122, as shown in FIG. 11 and FIG. 12.

Figure 13:
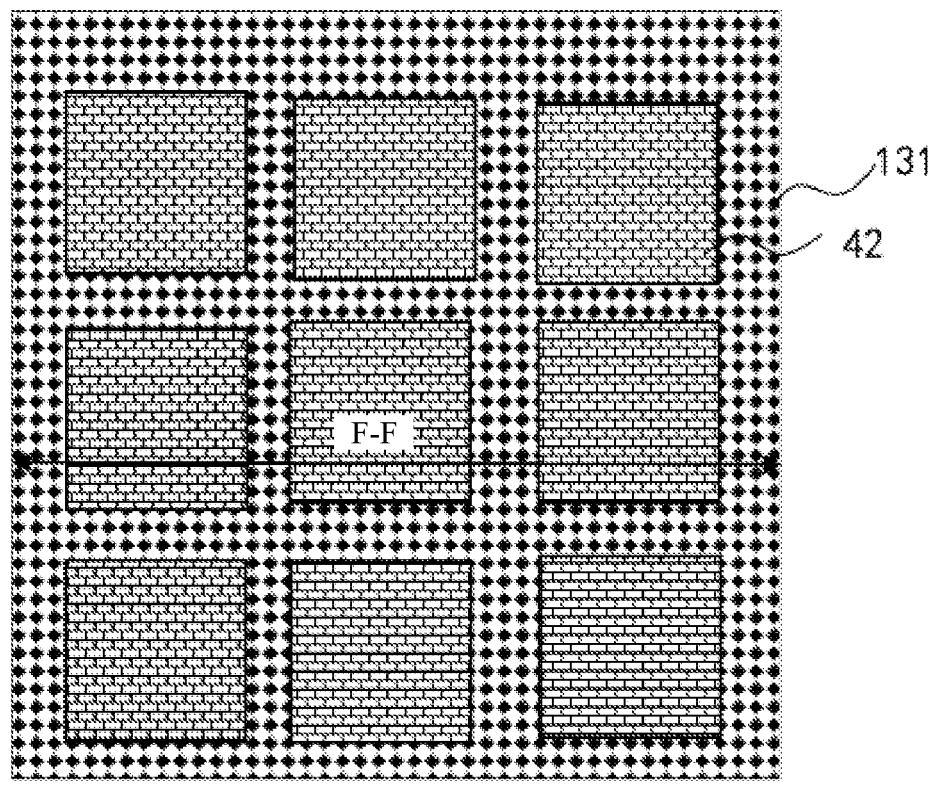
FIG. 13 is a top view illustrating the formation of a fourth semiconductor layer in a method for manufacturing a semiconductor structure according to an exemplary embodiment.
Figure 14:
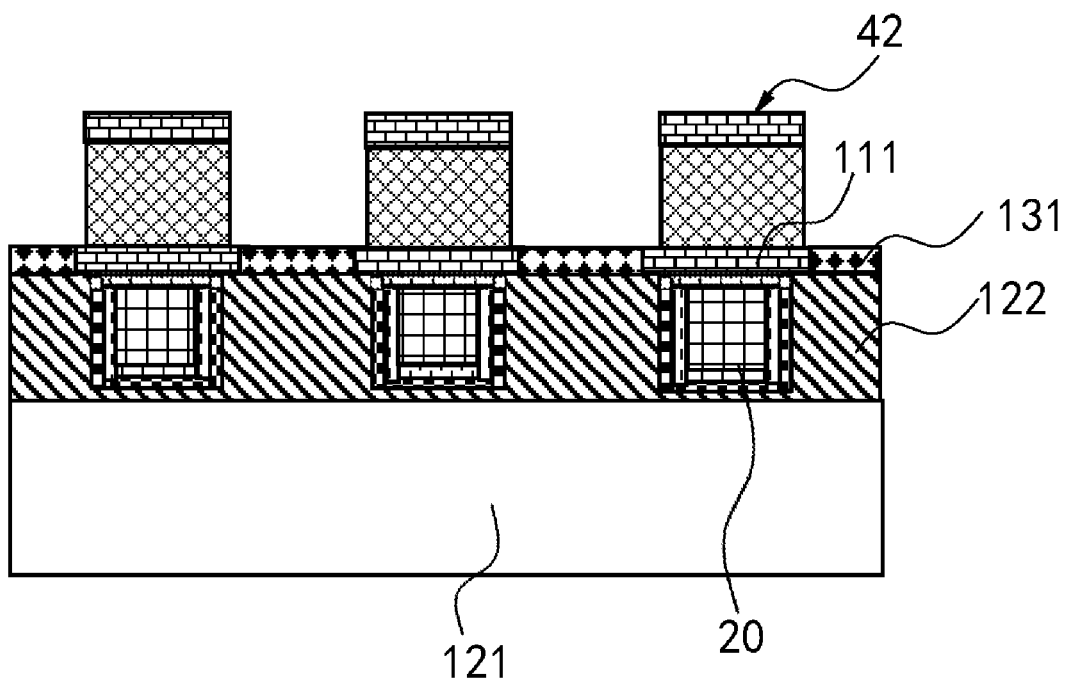
FIG. 14 is a cross-sectional view taken along F-F in FIG. 13.

On the basis of FIG. 11 and FIG. 12, the fourth semiconductor layer 42 is formed on the drain region 111. As shown in FIG. 13 and FIG. 14, the fourth semiconductor layer 42 is selectively etched to form the channel region 112 and the source region 113. The width of the channel region 112 is smaller than the width of the drain region 111, and the width of the channel region 112 is also smaller than the width of the source region 113, as shown in FIG. 15 and FIG. 16.

Figure 15:
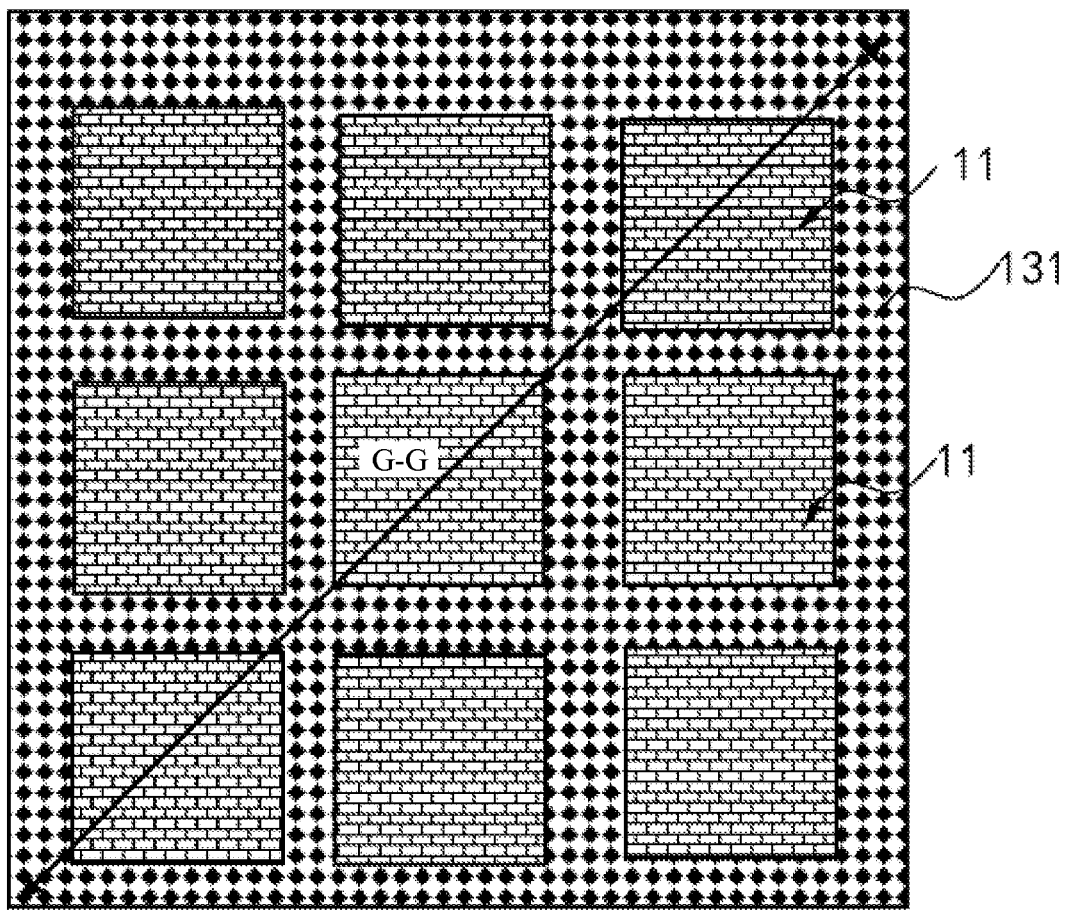
FIG. 15 is a top view illustrating the formation of a channel region and a source region in a method for manufacturing a semiconductor structure according to an exemplary embodiment.
Figure 16:
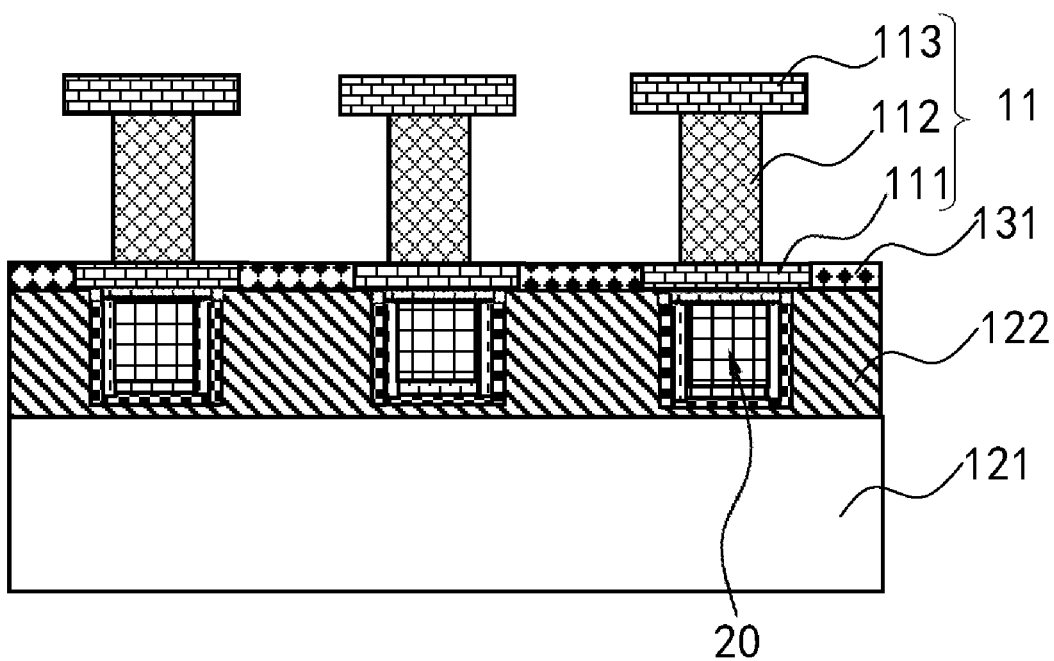
FIG. 16 is a cross-sectional view taken along G-G in FIG. 15.
Figure 17:
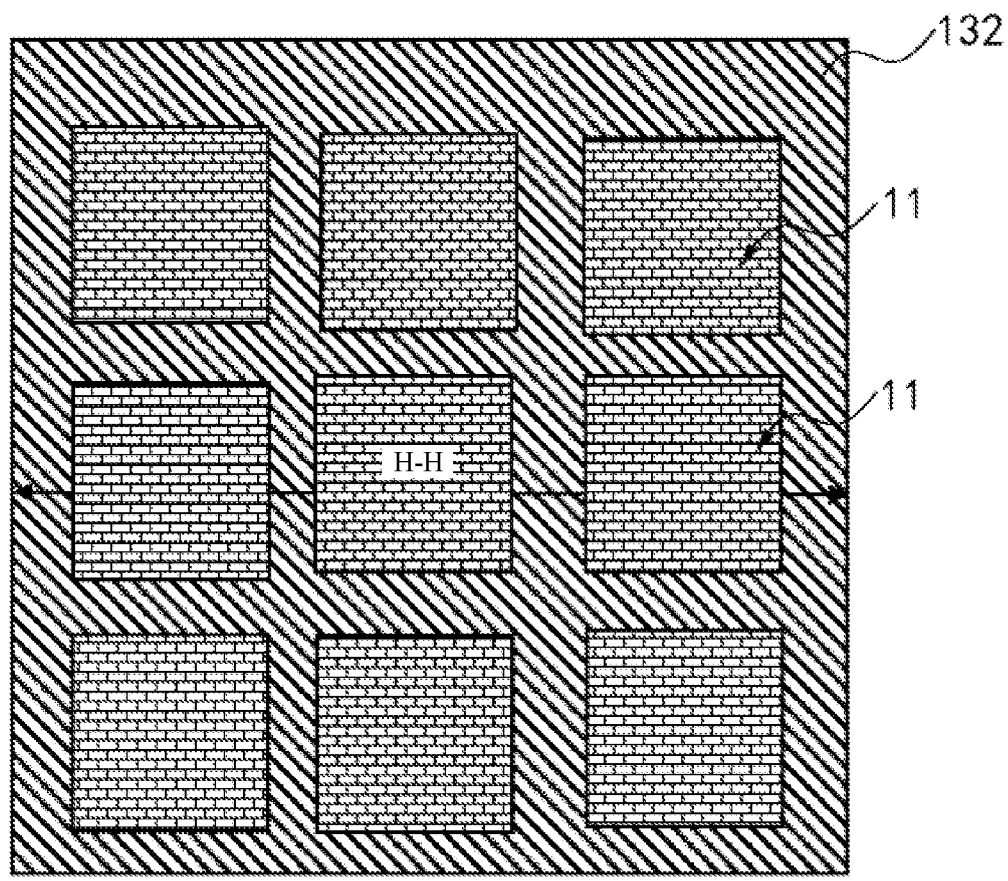
FIG. 17 is a top view illustrating the formation of a second insulating dielectric layer in a method for manufacturing a semiconductor structure according to an exemplary embodiment.
Figure 18:
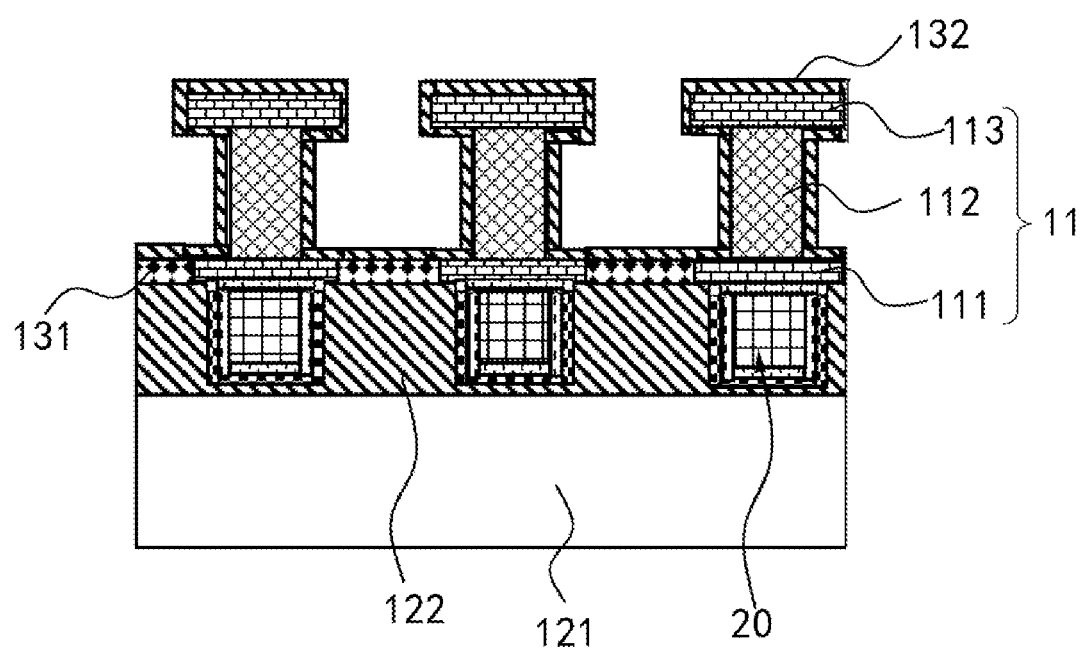
FIG. 18 is a cross-sectional view taken along H-H in FIG. 17.

On the basis of FIG. 15 and FIG. 16, the gate oxide layer 132 as shown in FIG. 17 and FIG. 18 is formed. The gate oxide layer 132 covers the first insulating dielectric layer 131, the top end of the drain region 111, the side wall of the channel region 112 as well as the bottom end, the side wall and the top end of the source region 113.

Figure 19:
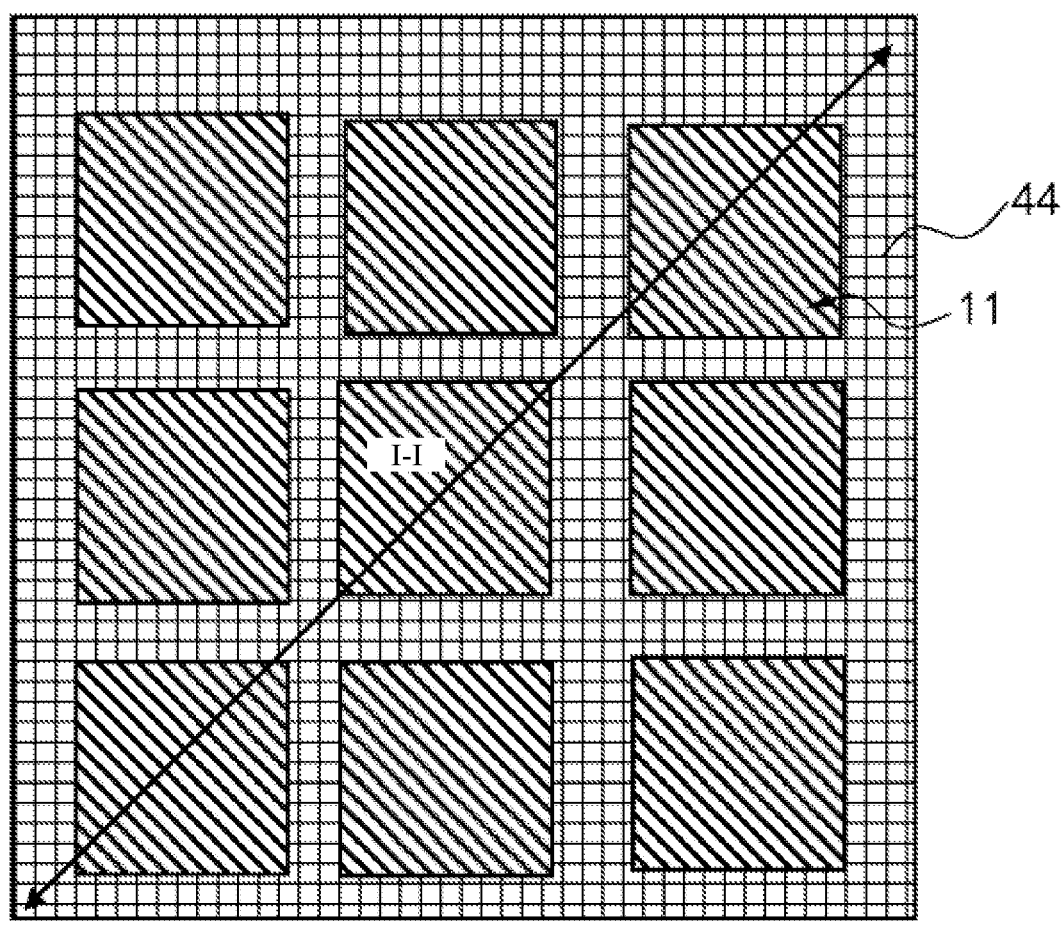
FIG. 19 is a top view illustrating the formation of a conductive material layer in a method for manufacturing a semiconductor structure according to an exemplary embodiment.
Figure 20:
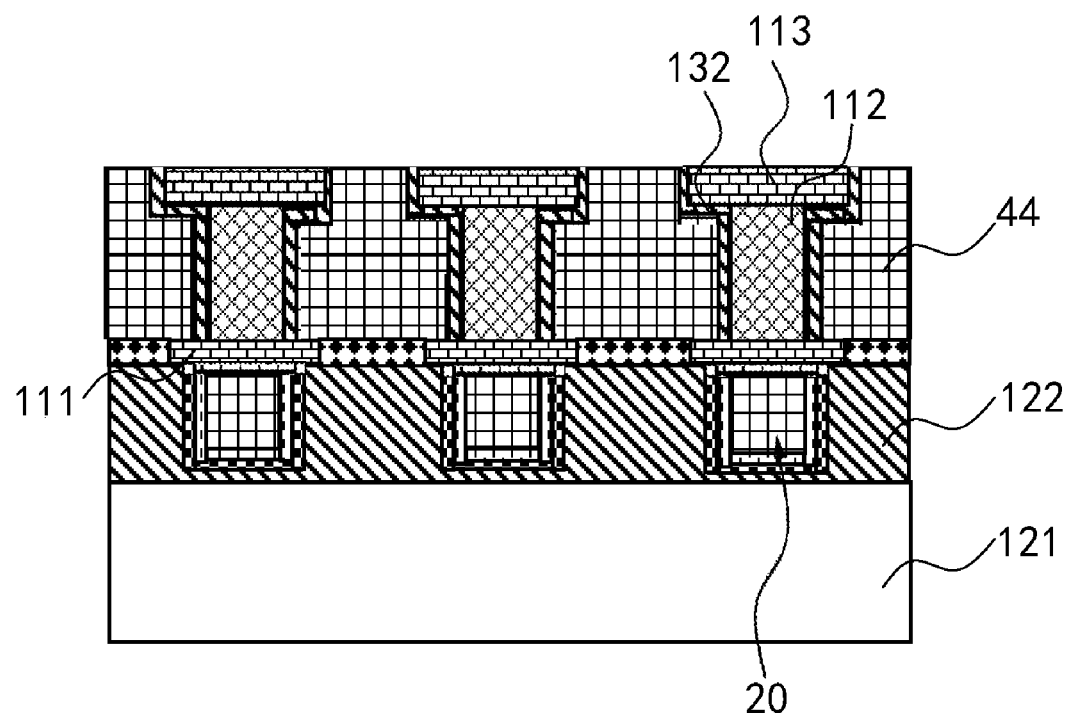
FIG. 20 is a cross-sectional view taken along I-I in FIG. 19.

On the basis of FIG. 17 and FIG. 18, a space between the active regions 11 is filled with the conductive material layer 44 to form a structure as shown in FIG. 19 and FIG. 20. A mask layer is formed above the conductive material layer 44 and the active regions 11, a mask pattern which corresponds to the area where the word line 30 is located is formed on the mask layer. An area outside the mask pattern is etched to form the word line 30 as shown in FIG. 21 and FIG. 22.

Figure 21:
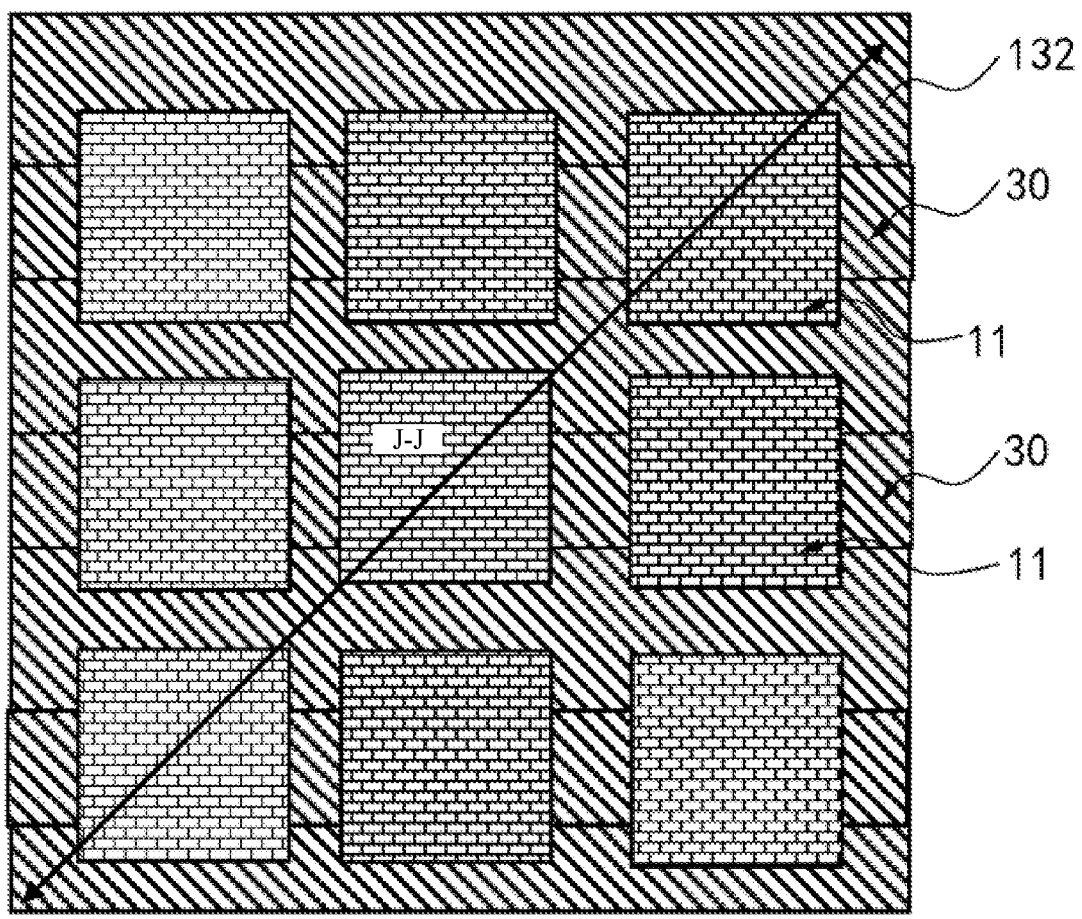
FIG. 21 is a top view illustrating the formation of a word line in a method for manufacturing a semiconductor structure according to an exemplary embodiment.
Figure 22:
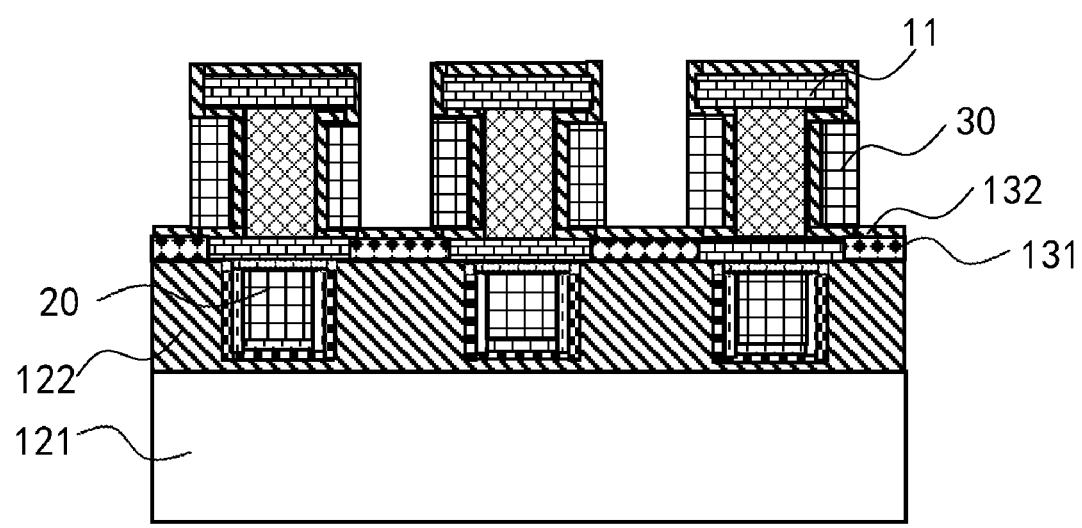
FIG. 22 is a cross-sectional view taken along J-J in FIG. 21.
Figure 23:
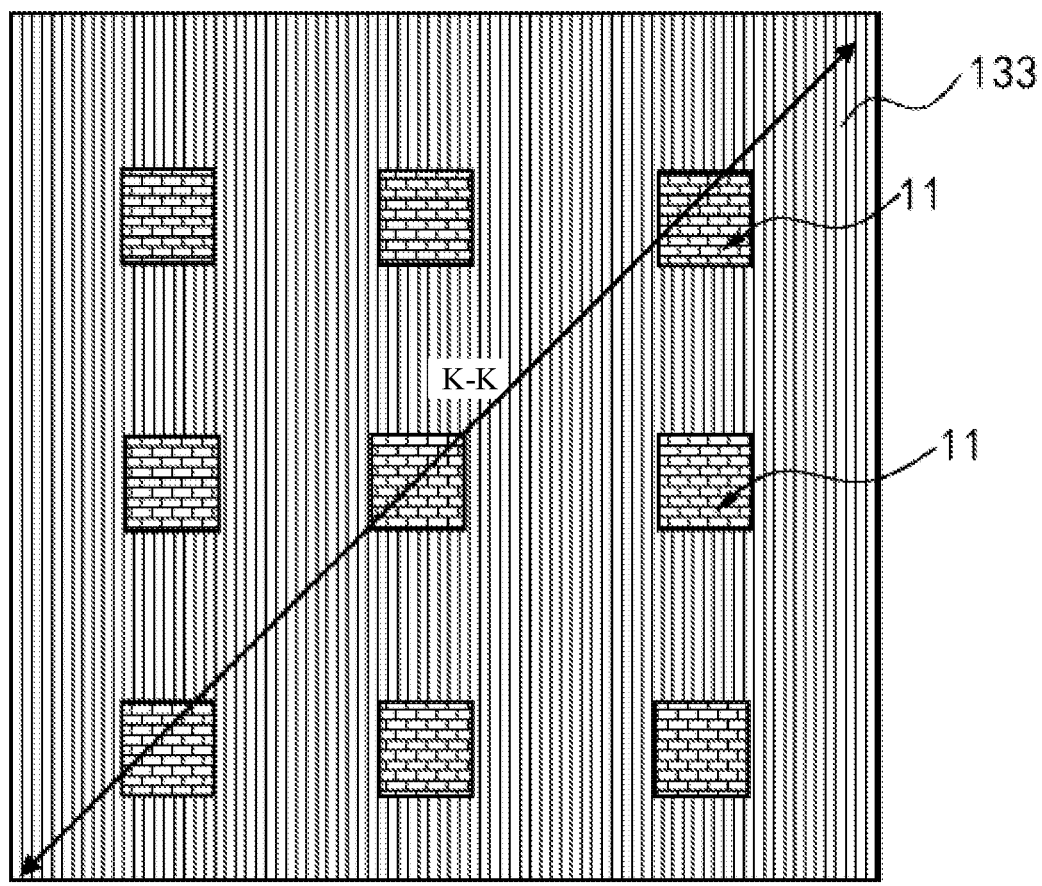
FIG. 23 is a top view illustrating the formation of a second insulating dielectric layer in a method for manufacturing a semiconductor structure according to an exemplary embodiment.
Figure 24:
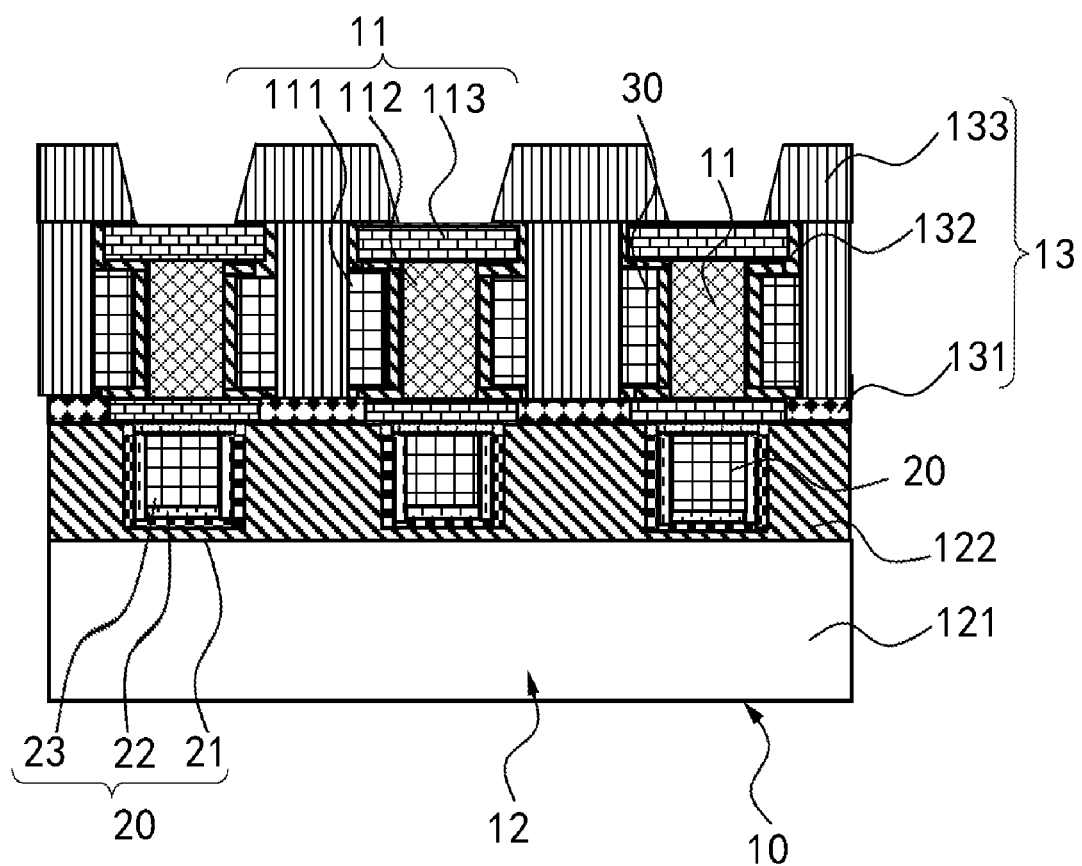
FIG. 24 is a cross-sectional view taken along K-K in FIG. 23.

On the basis of FIG. 21 and FIG. 22, the second insulating dielectric layer 133 as shown in FIG. 23 and FIG. 24 is formed. A hole for allowing the source region 113 to be connected to a memory element (for example, a memory capacitor) is formed in the top end of the second insulating dielectric layer 133. The second insulating dielectric layer 133 covers the top end of the source region 113.

It is to be noted that, when the second insulating dielectric layer 133 is formed, the gate oxide layer 132 on the first insulating dielectric layer 131 needs to be removed, so that the second insulating dielectric layer 133 is formed on the first insulating dielectric layer 131, and the gate oxide layer 132 only covers the active regions 11.

Specifically, the conductive material layer 44 may include Tungsten (W), and the first insulating dielectric layer 131, the gate oxide layer 132 and the second insulating dielectric layer 133 may be made of an insulating material, for example, $SiO_2$, SiOC, SiN, SiCN and the like, which may be not limited herein.

It is to be noted that, the first insulating dielectric layer 131, the gate oxide layer 132 and the second insulating dielectric layer 133 may be formed through a PVD process, a CVD process, an ALD process, a RPN process, a thermal oxidization process, an In-Situ Steam Generation (ISSG) process, a spin on dielectric (SOD) process and the like, which may be not limited herein.

It is to be noted that, a Chemical Mechanical Polishing (CMP) process is a general process which be matched with formation of a semiconductor structure. For example, the formed third semiconductor layer 41 may be ground and polished through the CMP process. Correspondingly, the first insulating dielectric layer 131, the gate oxide layer 132 and the second insulating dielectric layer 133 also may be ground and polished through the CMP process, which may be not limited herein and may be selected according to the specific needs.

An embodiment of the disclosure further provides a semiconductor structure. Referring to FIG. 23 and FIG. 24, the semiconductor structure includes a semiconductor base 10, a bit line 20 and a word line 30. The semiconductor base 10 includes a substrate 12 and an isolation structure 13 arranged above the substrate 12. The isolation structure 13 is configured to isolate a plurality of active regions 11 from each other. The bit line 20 is arranged in the substrate 12 and connected to the plurality of active regions 11. The word line 30 is arranged on the isolation structure 13, intersects with the plurality of active regions 11 and surrounds the plurality of active regions 11.

According to the semiconductor structure of an embodiment of the disclosure, the bit line 20 is arranged in the substrate 12, and connected to the plurality of active regions 11. The word line 30 intersects with the plurality of active regions 11 and surrounds the plurality of active regions 11. In such a manner, the unit configuration size on the semiconductor base 10 is small, that is, the size of the semiconductor structure is further reduced, and the control ability of the embedded type bit line 20 is stronger, so that the performance of the semiconductor structure is improved.

In an embodiment, as shown in FIG. 24, the bit line 20 includes a bit line isolation layer 21 arranged in the substrate 12, a barrier layer 22 covering the inner surface of the bit line isolation layer 21, and a conductive layer 23 arranged in the barrier layer 22. The barrier layer 22 covers the upper surface of the conductive layer 23, and the barrier layer 22 is connected to the active regions 11.

In an embodiment, the semiconductor structure includes a plurality of bit lines 20 extending in a first preset direction and a plurality of word lines 30 extending in a second preset direction. The first preset direction is perpendicular to the second preset direction.

In an embodiment, the substrate 12 is an SOI substrate, that is, the bit line 20 is arranged in the SOI substrate.

In an embodiment, a part of the active regions 11 are formed through the SOI substrate or none of the active regions 11 include the SOI substrate.

In an embodiment, the substrate 12 includes a first semiconductor layer 121, an oxide insulation layer 122 arranged on the first semiconductor layer 121, and a second semiconductor layer 123 arranged on the oxide insulation layer 122. The bit line 20 is arranged in the oxide insulation layer 122. The isolation structure 13 is arranged on the oxide insulation layer 122 and covers the second semiconductor layer 123. The active regions 11 include the second semiconductor layer 123.

It is to be noted that, the first semiconductor layer 121, the oxide insulation layer 122 and the second semiconductor layer 123 form the SOI in which the bit line 20 is arranged. During the manufacture of the semiconductor structure, a portion of the second semiconductor layer 123 is removed, and the remaining portion of the second semiconductor layer 123 forms the active regions 11.

In an embodiment, the substrate 12 includes the first semiconductor layer 121 and the oxide insulation layer 122, that is, the second semiconductor layer 123 is removed during the manufacture of the semiconductor structure.

In an embodiment, a bottom end of the bit line 20 is in contact with the oxide insulation layer 122, that is, the bit line 20 is arranged in the oxide insulation layer 122 so as to guarantee reliable isolation of the bit line 20.

In an embodiment, a top end of the bit line 20 is not higher than a lower surface of the second semiconductor layer 123. That is, the top end of the bit line 20 may be flush with the upper surface of the oxide insulation layer 122, or the top end of the bit line 20 may be arranged below the upper surface of the oxide insulation layer 122.

In an embodiment, the thickness of the oxide insulation layer 122 in a first direction is greater than 100 nm, in which the first direction is perpendicular to the first semiconductor layer 121.

In an embodiment, the thickness of the bit line 20 in the first direction ranges from 40 nm to 70 nm.

In an embodiment, the thickness of the bit line 20 in a second direction ranges from 30 nm to 70 nm, in which the first direction is perpendicular to the second direction.

It is to be noted that, the first direction may be understood as a vertical direction, and the second direction may be understood as a horizontal direction. Moreover, it may be further explained that the second direction is a horizontal direction parallel to the longitudinal section of the semiconductor structure in combination with FIG. 24.

In an embodiment, as shown in FIG. 24, each active region 11 includes a drain region 111 connected to the bit line 20 and formed through an Epi process, a channel region 112 arranged above the drain region 111, and a source region 113 arranged above the channel region 112. A part of the drain region 111 is formed through the substrate 12.

Specifically, the active region 11 includes the drain region 111, the channel region 112 and the source region 113. The drain region 111, the channel region 112 and the source region 113 respectively form a drain, a trench region and a source of a vertical type memory transistor. The drain region 111, the channel region 112 and the source region 113 are vertically arranged in a height direction, and the drain region 111 is arranged above the bit line 20 and connected to the bit line 20. That is to say, a bit line contact hole for connecting the bit lines 20 with each other is omitted. The unit configuration size of the vertical type memory transistor on the substrate 12 is small (for example, the unit configuration size is 4F2), and therefore the size of a memory may be further reduced.

In an embodiment, the thickness of the drain region 111 in the second direction is greater than the thickness of the bit line 20 in the second direction. In the embodiment, the thickness of the drain region 111 in second first direction is greater than the thickness of the bit line 20 in the second direction by 3 nm to 10 nm.

In an embodiment, the thickness of the drain region 111 in the second direction is greater than the thickness of the channel region 112 in the second direction, the thickness of the source region 113 in the second direction is greater than the thickness of the channel region 112 in the second direction. The word line 30 intersects with the channel region 112, that is, in terms of a spatial concept, the word line 30 is arranged between the drain region 111 and the source region 113, and the thickness of the word line 30 in the second direction may not be increased in the presence of the channel region 112.

It is to be noted that, each word line 30 intersects with the plurality of active regions 11. Here, each word line 30 spatially intersects with the plurality of active regions 11, that is, the word line 30 is not in contact with the plurality of active regions 11.

In an embodiment, both the active regions 11 and the word line 30 are arranged in the isolation structure 13.

In an embodiment, as shown in FIG. 24, the semiconductor structure further includes a gate oxide layer 132 arranged on the drain region 111 and covering the top end of the drain region 111, the side wall of the channel region 112 and the bottom end and the side wall of the source region 113. The gate oxide layer 132 is arranged between the word line 30 and the channel region 112. The active regions 11 are isolated from the word line 30 through the gate oxide layer 132. The gate oxide layer 132 which may be an oxide layer, that is, the gate oxide layer 132 forms an annular gate oxide layer for isolating the active regions 11 from the word line 30.

In an embodiment, as shown in FIG. 24, the isolation structure 13 includes a first insulating dielectric layer 131 arranged on the substrate 12. The first insulating dielectric layer 131 covers the side wall of the drain region 111, that is, the drain region 111 is encased in the first insulating dielectric layer 131.

In an embodiment, as shown in FIG. 24, the isolation structure 13 further includes a second insulating dielectric layer 133 arranged on the first insulating dielectric layer 131. The channel region 112, the source region 113 and the word line 30 are arranged in the second insulating dielectric layer 133. The gate oxide layer 132 is arranged between the second insulating dielectric layer 133 and the side wall of the source region 113. Adjacent two word lines 30 are isolated from each other through the second insulating dielectric layer 133, that is, the word lines 30 and the active regions 11 are embedded into the isolation structure 13.

It is to be noted that, the top end of the source region 113 is connected to a memory element (for example, a memory capacitor), and therefore the second insulating dielectric layer 133 may partially cover the top end of the source region 113; or the second insulating dielectric layer 133 may not cover the top end of the second insulating dielectric layer 133.

In an embodiment, a vertical type memory transistor is formed on an overlapped area in which the bit line 20 spatially intersects with the word line 30, the vertical type memory transistor is arranged on the bit line 20 and connected to the bit line 20, and one overlapped area corresponds to one vertical type memory transistor. The unit configuration size of the vertical type memory transistor on the semiconductor base 10 is greater than or equal to 4 times the square of the minimum feature size.

In an embodiment, a vertical type memory transistor is formed on an overlapped area in which the bit line 20 spatially intersects with the bit line 30, and the vertical type memory transistor is arranged on the bit line 20 and connected to the bit line 20. The width size D1 of one vertical type memory transistor in a direction perpendicular to the bit line 20 is twice the minimum feature size, and the width size D2 of one vertical type memory transistor in a direction perpendicular to the word line 30 is twice the minimum feature size.

It is to be noted that, the formed bit line 20 and the word line 30 have the minimum feature size F, and line spacing between adjacent bit lines 20 and line spacing between adjacent word lines 30 are greater than or equal to the minimum feature size F. The width size of one vertical type memory transistor in the direction perpendicular to the bit line is 2F, and the width size of one vertical type memory transistor in the direction perpendicular to the word line is also 2F. Therefore, the unit configuration size of the vertical type memory transistor may be correspondingly 4F2 (2F*2F, namely a 2×2 embedded type bit line structure). That is, the unit configuration size of the vertical type memory transistor is greater than or equal to 4 times the square of the minimum feature size. Compared with a 3×2 embedded type word line structure, the unit configuration size is smaller, namely stacking density is higher.

In an embodiment, a semiconductor structure may be obtained through the method for manufacturing the semiconductor structure described above.

It is to be noted that, the material of each structure layer of the semiconductor structure may refer to a material as described in the method for manufacturing the semiconductor structure, which may be not described again herein.

Other embodiments of the disclosure will be apparent to those skilled in the art after consideration of the specification and practice of the disclosure disclosed here. The disclosure is intended to cover any variations, uses, or adaptations of the disclosure, and the variations, uses, or adaptations follow the general principles of the disclosure and include common general knowledge or conventional technical means in the art undisclosed by the disclosure. The specification and examples are considered as examples only, and a true scope and spirit of the disclosure are indicated by the foregoing claims.

It will be appreciated that the disclosure is not limited to the exact structure that has been described above and illustrated in the accompanying drawings, and that various modifications and changes can be made without departing from the scope thereof. The scope of the disclosure is only limited by the appended claims.

What is claimed is:

1. A semiconductor structure, comprising:
   a semiconductor base comprising a substrate and an isolation structure, wherein the isolation structure is arranged above the substrate and configured to isolate a plurality of active regions from each other;
   at least one bit line arranged in the substrate and connected to the plurality of active regions; and
   at least one word line intersecting with the plurality of active regions and surrounding the plurality of active regions;
   wherein the substrate is a Silicon-On-Insulator (SOI) substrate;
   wherein the substrate comprises: a first semiconductor layer; an oxide insulation layer arranged on the first semiconductor layer, wherein the bit line is arranged in the oxide insulation layer; and a second semiconductor layer arranged on the oxide insulation layer;
   wherein the active regions comprise the second semiconductor layer; and
   wherein a bottom end of the bit line is in contact with the oxide insulation layer; and a top end of the bit line is not higher than a lower surface of the second semiconductor layer.

2. The semiconductor structure of claim 1, wherein a gate oxide layer at least covers a side wall of the source region.

3. The semiconductor structure of claim 1, wherein a vertical type memory transistor is formed on an overlapped area in which the bit line spatially intersects with the word line, the vertical type memory transistor is arranged on the bit line and connected to the bit line, one overlapped area corresponds to one vertical type memory transistor, and a unit configuration size of the vertical type memory transistor on the semiconductor base is greater than or equal to 4 times a square of a minimum feature size.

4. The semiconductor structure of claim 1, wherein the semiconductor structure comprises a plurality of bit lines extending in a first preset direction and a plurality of word lines extending in a second preset direction, wherein the first preset direction is perpendicular to the second preset direction.

5. The semiconductor structure of claim 1, wherein the bit line comprises:
   a bit line isolation layer arranged in the substrate;
   a barrier layer covering an inner surface of the bit line isolation layer; and
   a conductive layer arranged in the barrier layer, the barrier layer covering an upper surface of the conductive layer;
   wherein the barrier layer is connected to the active regions.

6. The semiconductor structure of claim 1, wherein a thickness of the oxide insulation layer in a first direction is greater than 100 nm, wherein the first direction is perpendicular to the first semiconductor layer.

7. The semiconductor structure of claim 6, wherein a thickness of the bit line in the first direction ranges from 40 nm to 70 nm; and a thickness of the bit line in a second direction ranges from 30 nm to 70 nm, wherein the first direction is perpendicular to the second direction.

8. The semiconductor structure of claim 1, wherein each active region comprises:
   a drain region connected to the bit line;
   a channel region arranged above the drain region; and
   a source region arranged above the channel region.

9. The semiconductor structure of claim 8, further comprising:
   a gate oxide layer covering a top end of the drain region, a side wall of the channel region and a bottom end and a side wall of the source region,
   wherein the word line intersects with the channel region, and the gate oxide layer is arranged between the word line and the channel region.

10. The semiconductor structure of claim 9, wherein the isolation structure comprises:
    a first insulating dielectric layer arranged on the substrate, wherein the first insulating dielectric layer covers a side wall of the drain region.

11. The semiconductor structure of claim 10, wherein the isolation structure further comprises:
    a second insulating dielectric layer arranged on the first insulating dielectric layer, the channel region, the source region and the word line being arranged in the second insulating dielectric layer,
    wherein the gate oxide layer is arranged between the second insulating dielectric layer and the side wall of the source region.

12. The semiconductor structure of claim 8, wherein a thickness of the drain region in a second direction is greater than a thickness of the bit line in the second direction by 3 nm to 10 nm; and the thickness of the drain region in the second direction is greater than a thickness of the channel region in the second direction, and a thickness of the source region in the second direction is greater than the thickness of the channel region in the second direction,
    wherein the second direction is parallel to the substrate.

13. A method for manufacturing a semiconductor structure, comprising:
    forming a substrate; wherein forming the substrate comprises: providing a first semiconductor layer; forming an oxide insulation layer on the first semiconductor layer; and forming a second semiconductor layer on the oxide insulation layer;
    forming a bit line in the substrate; wherein forming the bit line comprises: forming an opening in the substrate, wherein a bottom surface of the opening is arranged in the oxide insulation layer; and forming the bit line in the opening, wherein a top end of the bit line is not higher than a lower surface of the second semiconductor layer;
    forming a plurality of active regions on the substrate, wherein the bit line is connected to the plurality of active regions; and
    forming a word line above the bit line, wherein the word line intersects with the plurality of active regions and surrounds the plurality of active regions;
    wherein forming the active regions comprises:
    forming a third semiconductor layer on the second semiconductor layer, wherein the third semiconductor layer covers an upper surface of the bit line; and
    etching a portion of the second semiconductor layer and a portion of the third semiconductor layer, wherein a remaining portion of the second semiconductor layer and a remaining portion of the third semiconductor layer form a drain region;
    forming a fourth semiconductor layer on the drain region; and
    etching a portion of the fourth semiconductor layer, wherein a remaining portion of the fourth semiconductor layer forms a channel region and a source region, and the drain region, the channel region and the source region form the active regions.

14. The method for manufacturing the semiconductor structure of claim 13, wherein forming the word line comprises:
    forming a first insulating dielectric layer on the oxide insulation layer, wherein the first insulating dielectric layer covers a side wall of the drain region;
    forming a gate oxide layer on the first insulating dielectric layer, wherein the gate oxide layer covers a top end of the drain region, a side wall of the channel region and a bottom and a side wall of the source region;
    forming a conductive material layer on a surface of the gate oxide layer;
    etching the conductive material layer outside an area in which the word line is to be located, wherein a remaining portion of the conductive material layer forms the word line; and
    forming a second insulating dielectric layer on the first insulating dielectric layer, wherein the channel region, the source region and the word line are arranged in the second insulating dielectric layer, and the first insulating dielectric layer and the second insulating dielectric layer form an isolation structure.

15. The method for manufacturing the semiconductor structure of claim 13, wherein the third semiconductor layer is made of monocrystalline silicon, the drain region is formed by in-situ doping the monocrystalline silicon or implanting ions to the monocrystalline silicon after the monocrystalline silicon is formed based on the second semiconductor layer through an epitaxial process; and the fourth semiconductor layer is made of monocrystalline silicon, and the channel region and the source region are formed by in-situ doping said monocrystalline silicon or implanting ions to said monocrystalline silicon after said monocrystalline silicon is formed based on the drain region through an epitaxial process.

* * * * *